(12) United States Patent
Aoki

(10) Patent No.: US 10,409,127 B2
(45) Date of Patent: Sep. 10, 2019

(54) DISPLAY DEVICE

(71) Applicant: Japan Display Inc., Minato-ku (JP)

(72) Inventor: Yoshiro Aoki, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/603,747

(22) Filed: May 24, 2017

(65) Prior Publication Data

US 2017/0343844 A1 Nov. 30, 2017

(30) Foreign Application Priority Data

May 25, 2016 (JP) ................................. 2016-104241

(51) Int. Cl.
*G02F 1/1368* (2006.01)
*G02F 1/1343* (2006.01)
*G02F 1/1362* (2006.01)
*G06F 3/044* (2006.01)
*G09G 3/3225* (2016.01)
*G09G 3/36* (2006.01)
*H01L 27/32* (2006.01)
*G06F 3/041* (2006.01)
*G09G 3/3233* (2016.01)

(52) U.S. Cl.
CPC ........ *G02F 1/1368* (2013.01); *G02F 1/13624* (2013.01); *G02F 1/134363* (2013.01); *G02F 1/136213* (2013.01); *G02F 1/136286* (2013.01); *G06F 3/044* (2013.01); *G06F 3/0412* (2013.01); *G09G 3/3225* (2013.01); *G09G 3/3233* (2013.01); *G09G 3/3648* (2013.01); *G09G 3/3659* (2013.01); *H01L 27/3262* (2013.01); *H01L 27/3265* (2013.01); *H01L 27/3276* (2013.01); *G09G 2300/0861* (2013.01); *G09G 2310/0205* (2013.01); *G09G 2310/0262* (2013.01)

(58) Field of Classification Search
CPC ............. G02F 1/1368; G02F 1/134363; G02F 1/136213; G02F 1/13624; G02F 1/136286; G06F 3/0412; G06F 3/044; G09G 3/3225; G09G 3/3233; G09G 3/3648; G09G 3/3659; G09G 2300/0861; G09G 2310/0205; G09G 2310/0262; H01L 27/3262; H01L 27/3265; H01L 27/3276
See application file for complete search history.

(56) References Cited

U.S. PATENT DOCUMENTS

2010/0245700 A1* 9/2010 Zhao ................... G02F 1/13624
349/48
2015/0009465 A1* 1/2015 Park .................. G02F 1/133707
349/139

FOREIGN PATENT DOCUMENTS

JP 2006-163025 6/2006

* cited by examiner

*Primary Examiner* — Nathanael R Briggs
(74) *Attorney, Agent, or Firm* — Oblon, McClelland, Maier & Neustadt, L.L.P.

(57) ABSTRACT

According to one embodiment, a display device includes pixel circuits arranged in a matrix in a display area, and the pixel circuits each includes a display element, a capacitor which applies voltage to at least one of electrodes of the display element, a first switch which supplies voltage to the capacitor when in an on state, a second switch which is set in an off state with the first switch when the first switch is in the off state, and sets the capacitor in a floating state.

11 Claims, 10 Drawing Sheets

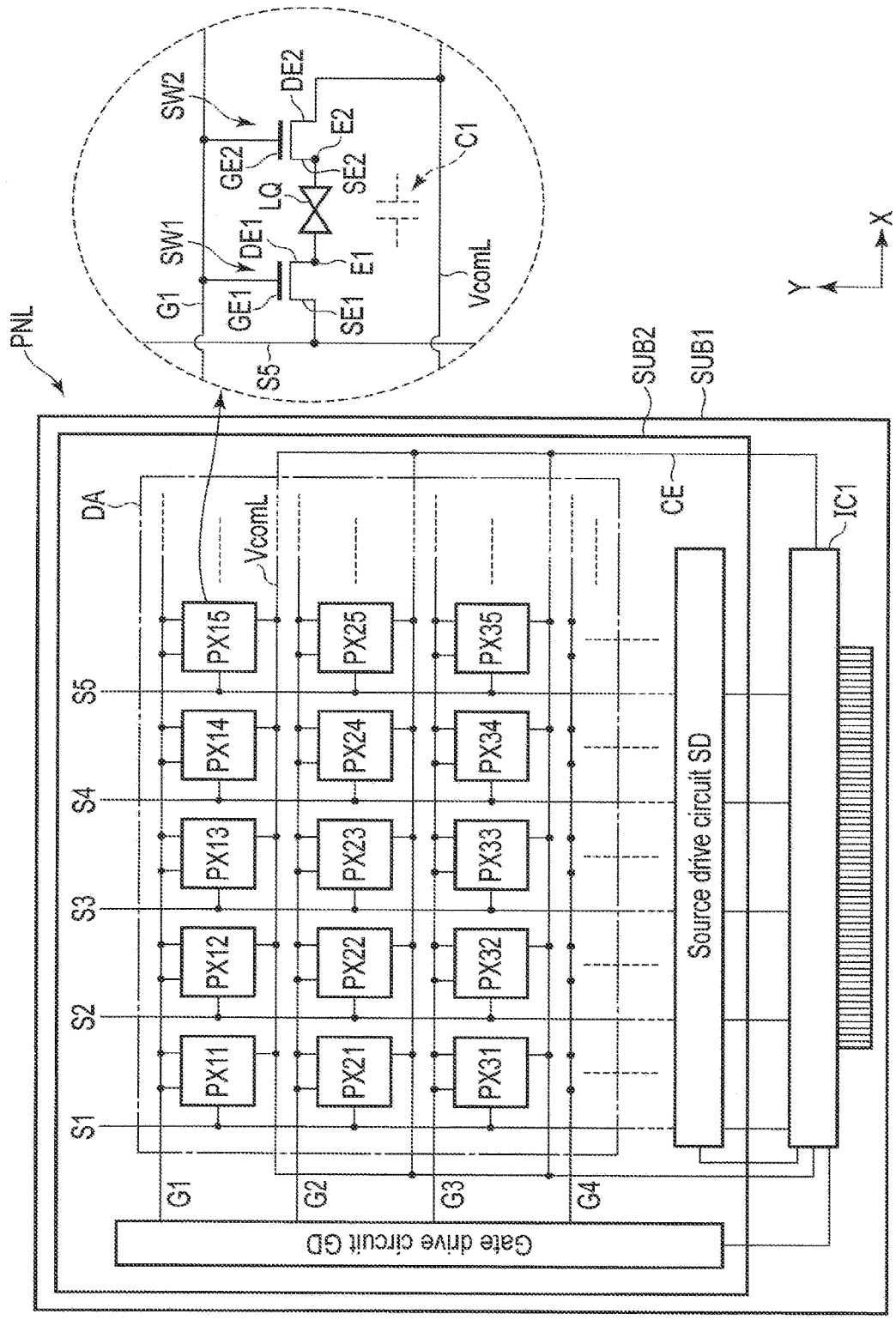
F I G. 1

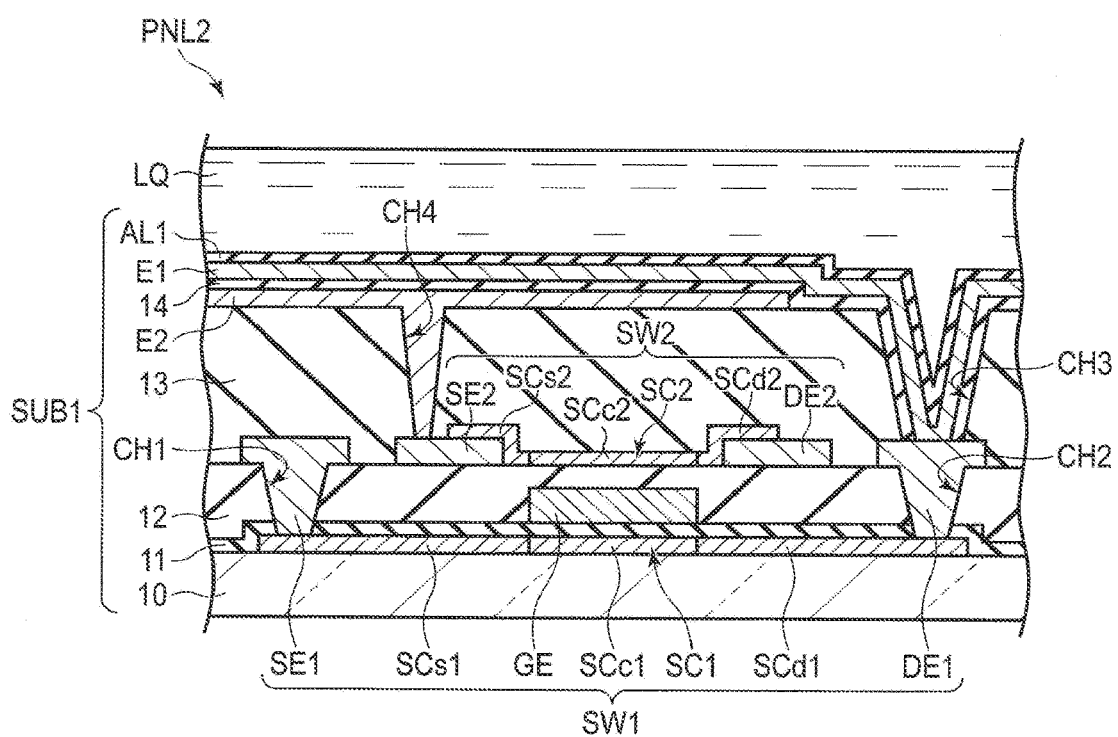
F I G. 4

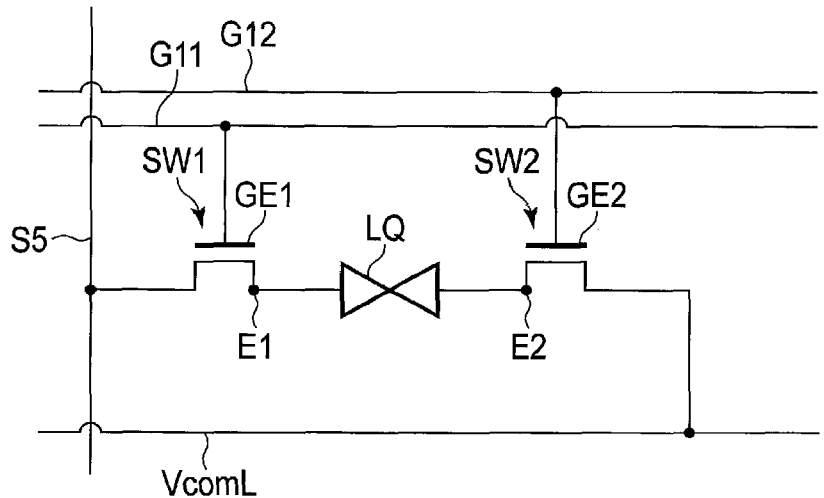
F I G. 6
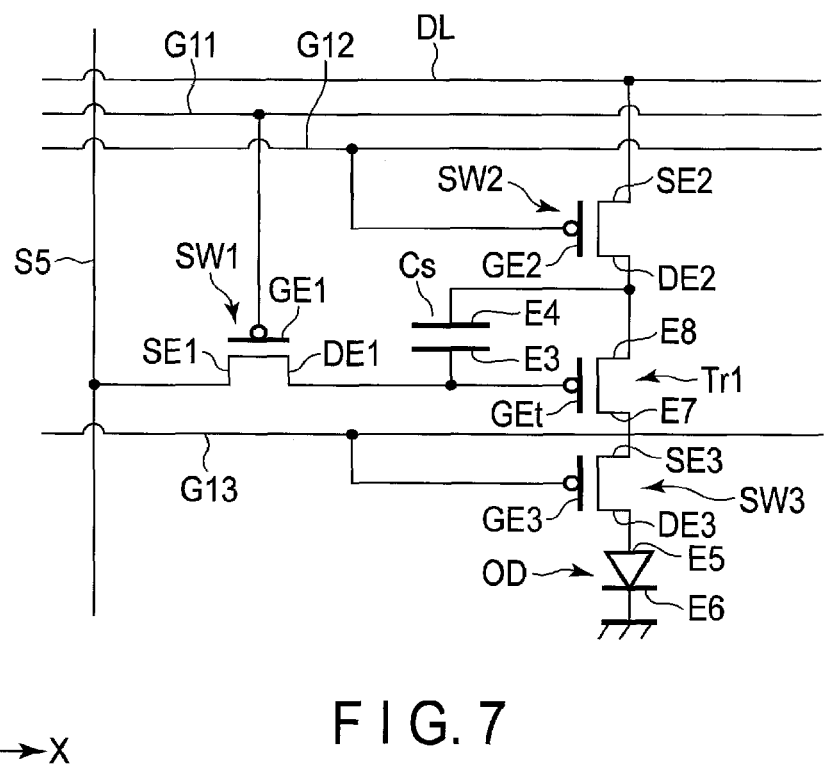
F I G. 7

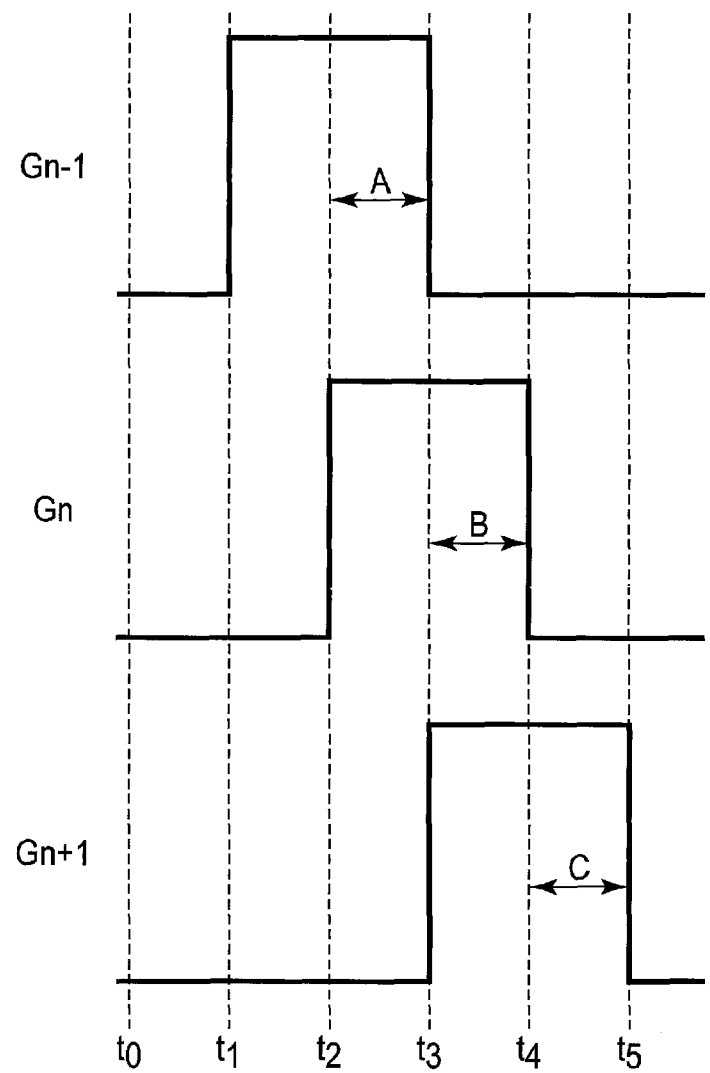
F I G. 11

DISPLAY DEVICE

CROSS-REFERENCE TO RELATED APPLICATIONS

This application is based upon and claims the benefit of priority from Japanese Patent Application No. 2016-104241, filed May 25, 2016, the entire contents of which are incorporated herein by reference.

FIELD

Embodiments described herein relate generally to a display device.

BACKGROUND

Recently, mobile terminals (such as personal computers, personal digital assistants (PDA), tablet computers) are widespread and high definition of the display images are also progressing. The mobile terminals with highly improved definition each include in its liquid crystal display as a display unit a very much increased number of pixels. The liquid crystal displays are driven with driver IC chips. The driver IC chips are formed from integrated circuits of silicon semiconductor devices, and the integrated circuits include an increasing number of output lines as the definition of the display images is enhanced.

As a result, the high-definition liquid crystal displays consume significantly high power as compared to before. As the power consumption increases, it becomes difficult to drive this liquid crystal display as a mobile terminal by a battery for a long time.

As a concept for reducing the power consumption, there is a method of driving a liquid crystal display at low voltage amplitude. But in order to achieve this method, it is necessary to realize a novel liquid crystal material operable at low voltage amplitude. At present, a novel liquid crystal material operable at low voltage amplitude and also available at low cost has not been developed.

In the meantime, for example, an active-matrix liquid crystal display includes pixel circuits arranged in a matrix. Each pixel circuit comprises a thin film transistor (TFT) which is controlled to be on/off by a gate line. In a write period, the TFT is turned on and an image signal (voltage) is written in between a pixel electrode and a common electrode for driving the liquid crystals. In a display period, the TFT is turned off and the voltage between the pixel electrode and the common electrode is retained, thereby maintaining the drive state of the liquid crystal molecules.

However, when it becomes possible to drive a liquid crystal display with low voltage amplitude as described above, the leak current of the TFT cannot be neglected. If the voltage between a pixel electrode and a common electrode is fluctuated due to leak current, the quality of the image display state by the respective pixel circuit is degraded. Further, if the leak current value varies among pixel circuits, the quality of the image display is also deteriorated.

BRIEF DESCRIPTION OF THE DRAWINGS

FIG. 1 is a circuit diagram showing an example of a display device according to the first embodiment.

FIG. 4 is a cross section showing an example of a display device according to the second embodiment.

FIG. 6 is a circuit diagram showing an example of a display device according to the fourth embodiment.

FIG. 7 is a circuit diagram showing an example of a display device according to the fifth embodiment.

FIG. 11 is a diagram showing an example of operation of the display device shown in FIG. 10.

DETAILED DESCRIPTION

Figure 2A:
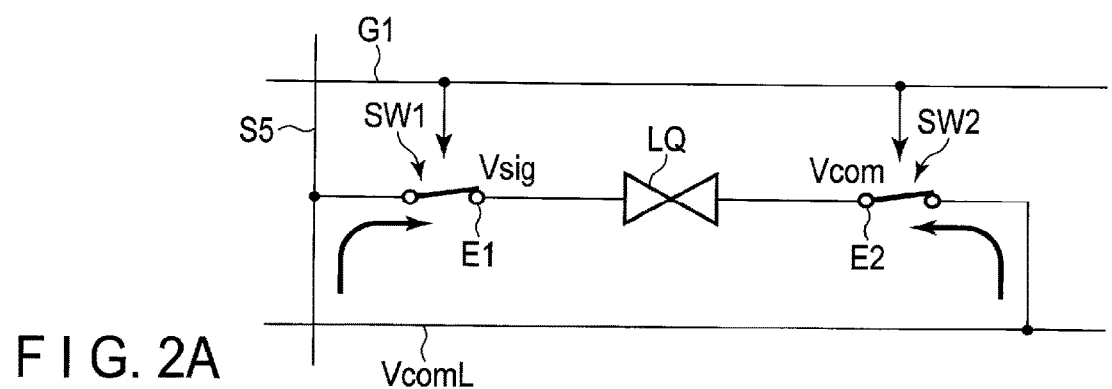
FIG. 2A is a diagram showing an example of operation of the display device shown in FIG. 1.

In general, according to one embodiment, a display device comprises: pixel circuits arranged in a matrix in a display area, the pixel circuits each comprising: a display element; a capacitor which applies voltage to at least one of electrodes of the display element; a first switch which supplies voltage to the capacitor when in an on state; and a second switch which is set in an off state with the first switch when the first switch is in the off state, and sets the capacitor in a floating state.

According to another embodiment, a display device comprises: a signal line; a first gate line and a second gate line arranged to cross the signal line; a common line to which a fixed potential is supplied; a first liquid crystal element including a first electrode and a second electrode; a first switch connected to the first electrode and the signal line; and a second switch connected to the second electrode and the common line, a control electrode of the first switch being connected to the first gate line, and a control electrode of the second switch being connected to the first gate line or the second gate line.

According to yet another embodiment, a display device comprising: a signal line; a first gate line and a third gate line arranged to cross the signal line; a power line to which a fixed potential is supplied, an organic EL device; a first switch connected to the signal line; a second switch connected to the power line; a third switch connected to the organic EL device; a capacitor including a third electrode and a fourth electrode; and a thin film transistor including an electrode connected to the third switch, another electrode connected to the second switch and the fourth electrode, and a control electrode connected to the first switch and the third electrode, a control electrode of the first switch being connected to the first gate line, and a control electrode of the third switch being connected to the third gate line.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

(First Embodiment)

FIG. 1 illustrates a configuration and an equivalent circuit of an active-matrix liquid crystal display panel PNL used in a liquid crystal display device according to an embodiment. Note that the main part of the embodiment is not limited to the liquid crystal display, but a luminous body (also called an organic light-emitting diode (OLED)) using an organic electroluminescence (organic EL) element may be used therefor. FIG. 1 shows a liquid crystal display as a typical example.

The liquid crystal display panel PNL comprises a plate-like first substrate SUB1, a plate-like second substrate SUB2 disposed to oppose the first substrate SUB1 and a liquid crystal layer held between the first substrate SUB1 and the second substrate SUB2. The liquid crystal layer is extremely thin as compared to the liquid crystal display panel PNL and is located in a region surrounded a seal member to attach the first and second substrates SUB1 and SUB2 together.

The liquid crystal display panels PNL may be any of a reflective type which displays images by selectively reflecting external light with a pixel electrode, or a transmissive type which displays images by selectively transmitting light from a backlight (not shown), and a trans-reflective type comprising a transmissive display function and a reflective display function. Moreover, the liquid crystal display panel PNL may be configured, as a mode to drive liquid crystals, to be provided for a lateral electric field mode in which a lateral electric field substantially parallel to a main surface of a substrate is used mainly, or a longitudinal electric field mode in which a longitudinal electric field substantially perpendicular to the main surface of the substrate is used mainly. Further, it may be configured to be provided for a display mode utilizing an oblique electric field or even such a display mode which utilizes these in combination.

The liquid crystal display panel PNL comprises, as signal supply sources which supply signals necessary to drive the panel, a gate drive circuit GD, a source driving circuit SD, and a device driver (may be called a liquid crystal driver) IC1, which is an integrated circuit, implemented in the first substrate SUB1.

The liquid crystal display panel PNL includes a display area (also called an active area) DA which displays images, in the region where the liquid crystal layer is held. The display area DA is formed in a rectangular shape, for example and comprises a plurality of pixels PX (PX11, PX12, . . . , PX21, PX22, . . . , PX31, PX32, PX33, . . . ) arranged in a matrix.

The first substrate SUB1 comprises, in the display area DA, a plurality of gate lines G (G1, G2, G3, G4, . . . ) extending along a first direction X, a plurality of common lines VcomL, a plurality of source lines S (S1, S2, S3, S4, S5, . . . ) extending along a second direction Y which crosses the first direction X. Note that the gate lines G may be called scanning lines, scanning signal lines or the like and the source lines S may be called signal lines, video signal lines or the like.

The gate lines G extend out to the outside of the display area DA along the first direction X, and are connected to a gate drive circuit GD. The source lines S extend out to the outside of the display area DA along the second direction Y, and are connected to a source drive circuit SD. The common lines VcomL extend out to the outside of the display area DA along the first direction X, for example, and are connected to the device driver IC1. The arrangement of the common lines VcomL may be changed as needed. Specifically, the common lines VcomL may be arranged parallel to the gate lines G, or may be arranged along the direction which crosses the gate lines G.

The gate drive circuit GD supplies gate signals to the gate lines G under the control of the device driver IC1. The source drive circuit SD supplies write signals (video signals) to the source lines S under the control of the device driver IC1. A fixed potential Vcom is supplied to the common lines VcomL.

Each pixel (may be called a pixel circuit) PX is configured as typically shown in the right-hand side of FIG. 1 (the region surrounded by the dashed line). This figure shows a basic structure of the pixel PX, but the structure thereof is not necessarily limited to that shown here.

The pixels PX of this embodiment each comprise first and second switches SW1 and SW2, a liquid crystal element (also called the liquid crystal layer) LQ as a display element, first and second electrodes E1 and E2, etc. In this embodiment, the first and the second switches SW1 and SW2 are each formed from, for example, an N-type thin film transistor (TFT). Note that in the following embodiment, those electrodes other than the control electrode (gate electrode) of a thin film transistor may be referred to as "source electrodes" or "drain electrodes" for convenience, but these expressions are not intended to limit the direction of current.

In each pixel PX, the liquid crystal element LQ is provided between the first switch SW1 and the second switch SW2. One electrode (first electrode E1) of the liquid crystal element LQ is connected to a source line S5 through the first switch SW1 and the other electrode (second electrode E2) is connected to a common line VcomL through the second switch SW2. More specifically, a source electrode SE1 of the first switch SW1 is connected to the source line S5 and a drain electrode DE1 is connected to the first electrode E1. On the other hand, a source electrode SE2 of the second switch SW2 is connected to the second electrode E2 and a drain electrode DE2 is connected to the common line VcomL. A gate electrode GE1 of the first switch SW1 and gate electrode GE2 of the second switch SW2 are connected to a gate line G1.

The alignment of the liquid crystal molecule in the liquid crystal layer LQ is controlled by the electric field produced between the first electrode E1 and the second electrode E2. The first electrode E1 and the second electrode E2 are disposed to oppose each other through at least an insulating film in each pixel PX, to constitute a capacitor C1, as will be described later. The capacitor C1 has a function of supplying voltage to the liquid crystal layer LQ as a display element.

Figure 2B:
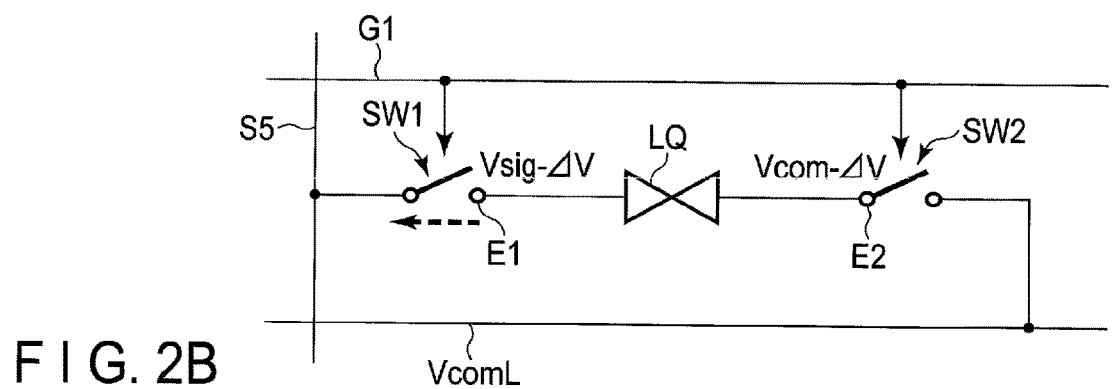
FIG. 2B is a diagram showing another example of the operation of the display device shown in FIG. 1.

FIGS. 2A and 2B are circuit diagrams equivalent to a pixel PX illustrated to describe an example of operation of the pixel PX.

Let us suppose now that a gate signal of high level (positive polarity) is supplied to a gate line G1, and a write signal (video signal) is supplied to a source line S5 in synchronism with the gate signal as shown in FIG. 2A. Then, the first and second switches SW1 and SW2 are switched to an on state based on the high-level gate signal.

Thereby, a signal potential Vsig corresponding to the video signal is supplied to the first electrode E1 from the source line S5 through the first switch SW1. To the second electrode E2, the fixed potential Vcom is supplied from a common line VcomL through the second switch SW2. Here, where the potential of the first electrode E1 is represented by VE1 and that of the second electrode E2 is VE2, voltage VLQ applied to the liquid crystal layer LQ provided between the first electrode E1 and the second electrode E2 is expressed by:

$$VLQ = VE1 - VE2 = Vsig - Vcom.$$

Let us suppose here an example in which the potential of a write signal is 9V and the fixed potential Vcom is 5V. In other words, a potential of 9V is supplied to the first electrode E1, a potential of 5V is supplied to the second electrode E2, and a voltage of 4V is applied to the liquid crystal layer LQ.

Next, let us suppose that a gate signal of low level (negative polarity) is supplied to the gate line G1, and a signal potential Vsig of 1V is supplied to the source line S5 in synchronism with this gate signal as shown in FIG. 2B. Then, the first and second switches SW1 and SW2 are switched to an off state based on the low-level gate signal. Thereby, the liquid crystal layer LQ is placed in a floating state.

At this time, a potential difference of, for example, 8V (9−1=8) is created between the source and drain electrodes of the first switch SW1. On the other hand, a potential of 5V is being supplied to the common line VcomL, no potential difference is created between the source and drain electrodes of the second switch SW2.

Here, let us further suppose that leak current occurs in the first switch SW1 due to the potential difference between the source and drain electrodes. Then, the potential VE1 of the first electrode E1 decreases by only the potential displacement ΔV caused by the leak current, and is expressed by:

$$VE1 = Vsig - \Delta V.$$

Now, the second switch SW2 is in the off state, and therefore the fixed potential Vcom (namely, potential of 5V) is not supplied to the second electrode E2 from the respective common line VcomL. Here, when the potential VE1 of the first electrode E1 decreases by only the potential displacement ΔV caused by the leak current, the potential VE2 of the second electrode E2 decreases by only ΔV as in the case of the first electrode E1 and is expressed by:

$$VE2 = Vcom - \Delta V.$$

Note here that the potential difference between the source and drain electrodes of the second switch SW2 is thus ΔV, but which is sufficiently low as compared to the potential difference between the source and drain electrodes of the first switch SW1; the leak current occurring between the source and the drain of the second switch SW2 can be neglected. That is, the potential VE2 of the second electrode E2 is maintained at: Vcom−ΔV.

Therefore, voltage VLQ' applied to the liquid crystal layer LQ after leak current occurs in the first switch SW1 is expressed by:

$$VLQ' = VE1 - VE2 = (Vsig - \Delta V) - (Vcom - \Delta V)$$
$$= Vsig - Vcom = VQL.$$

That is, the voltage applied to the liquid crystal layer LQ ideally does not vary between before and after leakage occurs in the first switch SW1.

According to this embodiment, the first switch SW1 and the second switch SW2 are provided in both ends of the liquid crystal element LQ. With this structure, when a write to a pixel PX is finished and the pixel PX is in a retention state, the liquid crystal element LQ can be placed in a floating state. Thus, even if leak current occurs in the first switch SW1 while a pixel PX is in a retention state to create the potential displacement ΔV in the potential VE1 of the first electrode E1, a potential displacement ΔV similar to that of the first electrode E1 can be created in the potential VE2 of the second electrode E2. That is, it is possible to suppress the variation of voltage applied to the liquid crystal layer LQ provided between the first electrode E1 and the second electrode E2 before and after the leak current occurs in the first switch SW1. Therefore, the video signal can be maintained for a long time. Consequently, it becomes possible to achieve the low voltage amplitude, and thereby to decrease the power consumption. Naturally, the operation of the device can contribute also to improvement in definition and quality of display image. Moreover, since the video signal can be maintained stably for a long time, it is effective also for the device to drive at low frequency to reduce power consumption. Note that a low frequency drive here means to drive a frame frequency at, for example, 30 Hz or 15 Hz.

Figure 3:
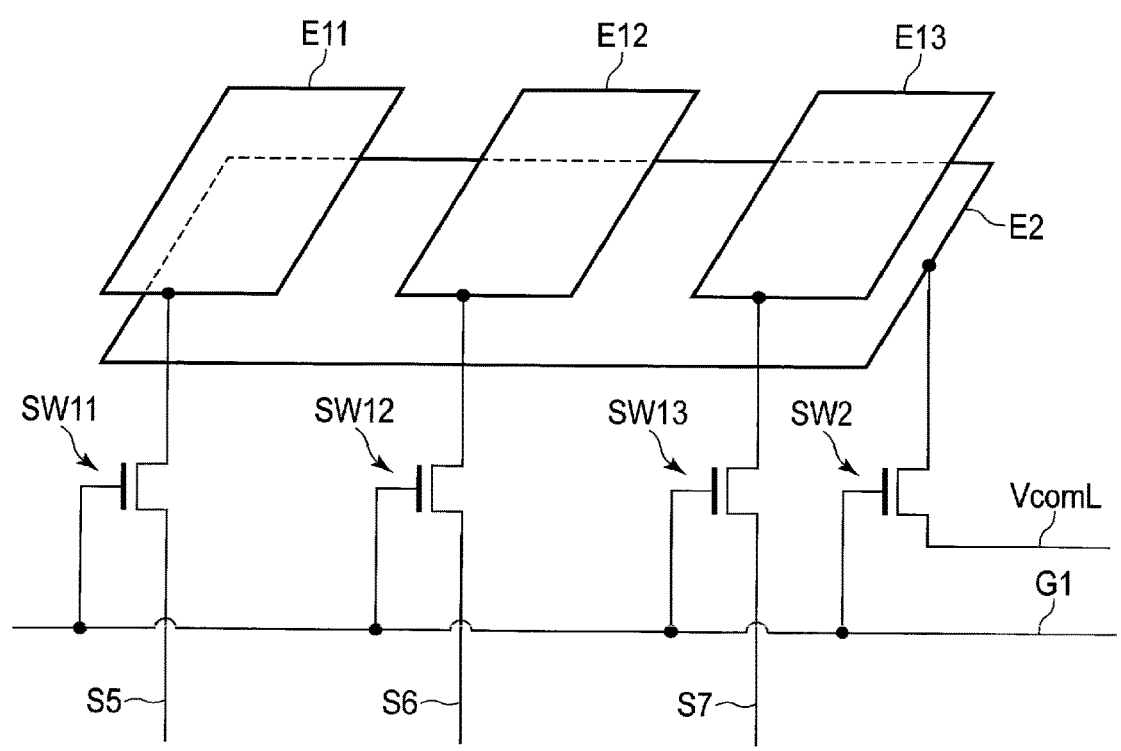
FIG. 3 is a diagram schematically showing another example of the display device according to the first embodiment.

In the above-described example, each pixel PX is provided with the first switch SW1 and the second switch SW2, but the second switch SW2 may be shared by a plurality of pixels PX (or sub-pixels). More specifically, as shown in FIG. 3, one second switch SW2 may be provided to three first switches SW11, SW12 and SW13.

For example, the first electrode E11 connected to the first switch SW11 may be provided in a pixel which displays red, the first electrode E12 connected to the first switch SW12 may be provided in a pixel which displays green, the first electrode E13 connected to the first switch SW13 is provided in a pixel which displays blue, and the second electrode E2 to which the second switch SW2 is connected may be provided commonly for these three pixels. In this case, the three pixels are switched collectively by the second switch SW2 to the floating state. In this manner, advantageous effect similar to that of the pixel the structure of which is shown in FIGS. 2A and 2B can be obtained.

(Second Embodiment)

FIG. 4 is a cross section schematically showing a part of a liquid crystal display panel PNL2 used in a display device according to the second embodiment. The liquid crystal display panel PNL2 of the second embodiment is configured to be provided for the lateral electric field mode using a lateral electric field substantially parallel to the main surface of the substrate mainly as the mode to drive the liquid crystal. Here, of the first substrate SUB1 and the second substrate SUB2 which constitute the liquid crystal display panel PNL2, the second substrate SUB2 is omitted from the illustration.

The first substrate SUB1 is formed from, for example, a transparent insulating substrate 10 such as of glass or resin. The first substrate SUB1 comprises a first switch SW1, a second switch SW2, a first electrode E1, a second electrode E2, first to fourth insulating films 11 to 14, on a side thereof, which opposes the second substrate SUB2 (not shown).

The first switch SW1 is a top-gate thin film transistor, for example, and is formed on the insulating substrate 10. The first switch SW1 comprises a first semiconductor layer SC1, a gate electrode (control electrode) GE, a source electrode SE1, a drain electrode DE1 and the like.

The first semiconductor layer SC1 includes a source region SCs1 and a drain region SCd1 provided in both end regions thereof, for example, and a channel region SCc1 provided between the source region SCs1 and drain region SCd1, on the insulating substrate 10. The first insulating film 11 is formed to cover the first semiconductor layer SC1 and also on the insulating substrate 10. The first insulating film 11 functions as a gate insulating film of the first switch SW1.

The gate electrode GE is formed in a region on the first insulating film 11, which overlaps the channel-region SCc1 of the first semiconductor layer SC1.

The second insulating film 12 is formed to cover the gate electrode GE and also on the first insulating film 11.

The source electrode SE1 and the drain electrode DE1 of the first switch SW1 are provided on the second insulating film 12. The source electrode SE1 and the drain electrode DE1 are connected respectively to the source region SCs1 and the drain region SCd1 of the first semiconductor layer SC1 through contact holes CH1 and CH2 formed in the second insulating film 12 and the first insulating film 11. The source electrode SE1 is connected to the source line (signal line) S of the display device via a wiring line (not shown).

The second switch SW2 is a bottom-gate thin film transistor, for example, and comprises a second semiconductor layer SC2, a gate electrode GE, a source electrode SE2, a drain electrode DE2 and the like. In this embodiment, the second switch SW2 is formed, for example, immediately above the region where the first switch SW1 is formed, to share the gate electrode GE with the first switch SW. In the second switch SW2, the second insulating film 12 functions as a gate insulating film.

The source electrode SE2 and the drain electrode DE2 of the second switch SW2 are formed on the second insulating film 12 and between the source electrode SE1 and the drain electrode DE1 of the first switch SW1, for example. The source electrode SE2 and the drain electrode DE2 are provided apart from each other so as not to overlap, for example, the region where the gate electrode GE is formed. The drain electrode DE2 is connected to a common lines VcomL through a wiring line (not shown).

The second semiconductor layer SC2 is formed between the source electrode SE2 and drain electrode DE2 on the second insulating film 12 and also partially on the source and drain electrodes SE2 and DE2. The second semiconductor layer SC2 includes a source region SCs2 and a drain region SCd2 provided in both end regions thereof, and a channel region SCc2 provided between the source region SCs2 and the drain area SCd2. The channel region SCc2 of the second semiconductor layer SC2 is formed in a region which overlaps the region where the gate electrode GE is formed.

That is, the channel region SCc2 of the second semiconductor layer SC2 is formed directly above the gate electrode GE via the second insulating film 12, and the channel region SCc1 of the first semiconductor layer SC1 is formed directly under the gate electrode GE via the first insulating film 11. Note that the channel region SCc2 of the second semiconductor layer SC2 and the channel region SCc1 of the first semiconductor layer SC1 may be formed to at least partially overlap each other.

The third insulating film 13 is formed to cover the second semiconductor layer SC2, the source electrodes SE1 and SE2, the drain electrodes DE1 and DE2 and also on the second insulating film 12. In the third insulating film 13, formed are a contact hole CH4 which exposes a part of the source electrode SE2 of the second switch SW2 and a contact hole CH3 which exposes a part of the drain electrode DE1 of the first switch SW1. The third insulating film 13 is formed from a light-transmissive organic insulating material.

The second electrode E2 is formed on the third insulating film 13 except for the contact hole CH3 and its peripheral portion. The second electrode E2 is connected to the source electrode SE2 of the second switch SW2 through the contact hole CH4 formed in the third insulating film 13.

The fourth insulating film 14 is formed to cover the second electrode E2 and also on the third insulating film 13 and the side surface of the contact hole CH3. The first, second and fourth insulating films are each formed from, for example, an inorganic insulating material such as silicon oxide, silicon nitride, silicon oxynitride or aluminum nitride. Note that it suffices if the fourth insulating film 14 covers at least the second electrode E2, and it need not be provided in the contact hole CH3.

The first electrode E1 is formed on the fourth insulating film 14. The first electrode E1 is connected to the drain electrode DE1 of the first switch SW1 in a bottom portion of the contact hole CH3. The first electrode E1 is covered with a first alignment film AL1.

The second electrode E2, the fourth insulating film 14, and the first electrode E1 constitute the capacitor C1 shown in FIG. 1. According to the voltage held at this capacitor C1, the alignment of the liquid crystal element LQ is controlled. The capacitance of the capacitor C1 is controlled by the area of the first electrode E1 and the area of the second electrode E2.

This embodiment illustrates an example case where the first electrode E1 is formed above the second electrode E2, but the second electrode E2 may be formed above the first electrode E1.

According to this embodiment, the first semiconductor layer SC1 of the first switch SW1 and the second semiconductor layer SC2 of the second switch SW2 are formed as different layers on the insulating substrate 10 so that the first switch SW1 and the second switch SW2 overlap each other. More specifically, the gate electrode GE is formed on the first semiconductor layer SC1 of the first switch SW1 via the first insulating film 11, and the second semiconductor layer SC2 is provided on the gate electrode GE via the second insulating film 12. With this configuration, the area occupied by the first switch SW1 and the second switch SW2 in a plane parallel to the main surface of the substrate can be reduced as compared to the case where, for example, the first semiconductor layer SC1 and the second semiconductor layer SC2 are provided in the same layer. Therefore, in the display device, the reduction of the area which contributes to display, that is, the decrease in aperture ratio, can be suppressed.

Note that a liquid crystal capacitance represented by the capacitor C1 exists between the first electrode E1 connected to the first switch SW1 and the second electrode E2 connected to the second switch SW2, but parasitic capacitances are created between the first electrode E1 and other wiring lines and between the second electrode E2 and other wiring lines. In other words, patterns having large areas such as the first electrode E1 and the second electrode E2 may cause various parasitic capacitances (including capacitances via the channels of TFTs as well) between themselves and neighboring wiring lines such as the source lines S and gate lines G. Here, the first electrode E1 and the second electrode E2 are arranged in different locations along a longitudinal or lateral direction in layout, or they differ in shape, and therefore the values of parasitic capacitances rarely become the same. It is considered as a result that the first electrode E1 and the second electrode E2 have different video-signal retention capabilities for holding video signals due to the difference in the total value of parasitic capacitance. Here, when one with a higher total value of parasitic capacitance is assigned as the first electrode E1, the capability to hold a video signal can be improved (that is, the voltage applied to the liquid crystal layer LQ becomes hardly variable even if leak current occurs).

The reason why the capability to hold a video signal is improved is considered as follows. That is, first, in the first switch SW1, the voltage between the source and drain electrodes in a maintenance period is originally high, and therefore potential fluctuation of the first electrode E1 due to leak current is unavoidable. In place, it suffices if the potential of the second electrode E2 connected to the second switch SW2 can follow the potential fluctuation of the first electrode E1. This embodiment is based on this concept. Next, in order for the potential of the second electrode E2 to easily follow the potential fluctuation of the first electrode E1, it is desirable that the second electrode E2 be of a low (small) capacitance. This is because it is effective to avoid as much as possible the potential fluctuation from being suppressed, which may be caused when the potential is fixed by the parasitic capacitance (note that the potential difference between the source and drain electrodes of the second switch SW2 is very small, the influence of the leak current through the second switch SW2 can be neglected). Thus, it is easier for the potential of the second electrode E2 to follow the potential fluctuation of the first electrode E1 when the total value of the parasitic capacitance of the second electrode E2 is lower than that of the first electrode E1. Thus, the video signal retention capability described above can be improved.

(Third Embodiment)

Figure 5:
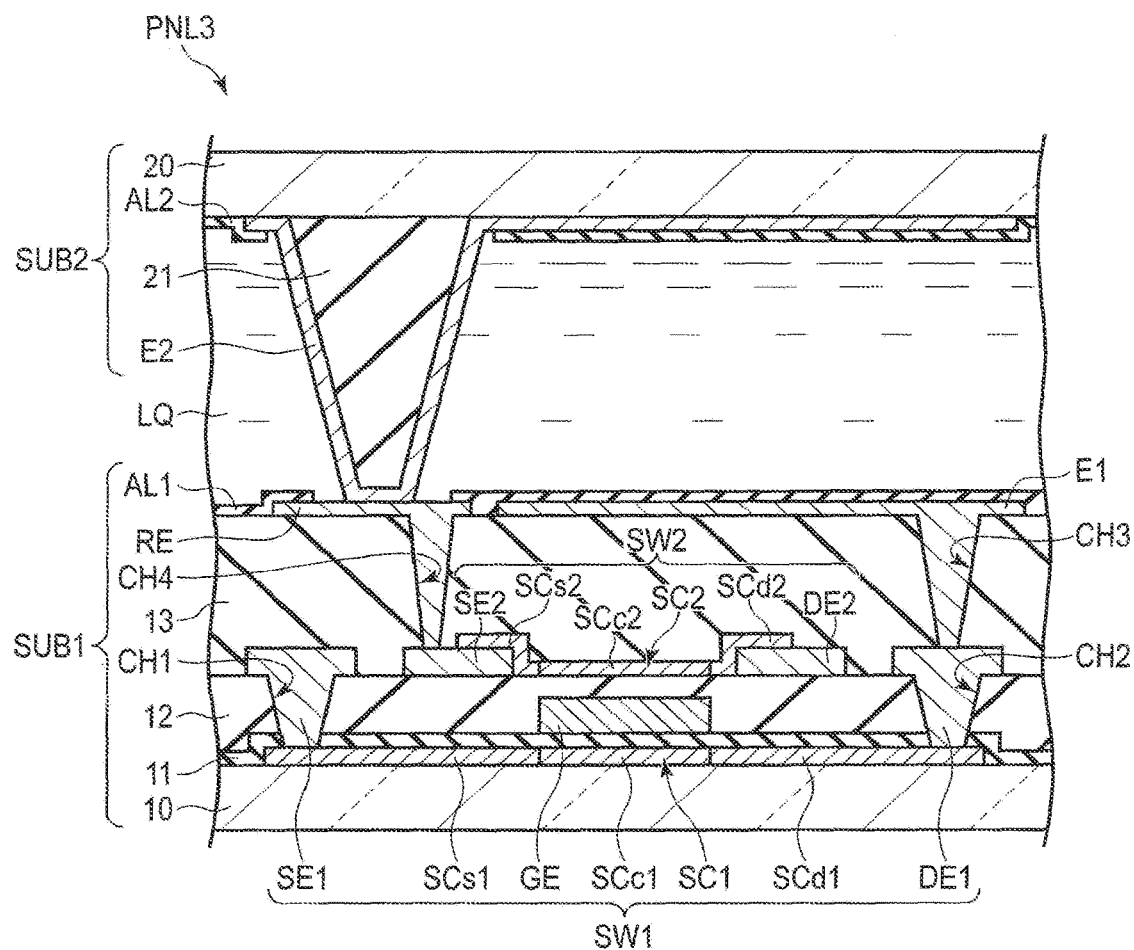
FIG. 5 is a cross section showing an example of a display device according to the third embodiment.

FIG. 5 is a cross section schematically showing a liquid crystal display panel PNL3 used in a display device according to the third embodiment. The third embodiment is different from the second embodiment in that the liquid crystal drive mode is the vertical electric field mode which uses an electric field perpendicularly crossing the main surface of the substrate mainly. That is, in the third embodiment, for example, a first electrode E1 is formed on a first substrate SUB1 and a second electrode E2 is formed on a second substrate SUE2.

In this embodiment, the first substrate SUB1 comprises an insulating substrate 10, first to fourth insulating films 11 to 14, a first switch SW1, a second switch SW2, a first electrode E1, a relay electrode RE and the like. The structure from the insulating substrate 10 to the third insulating film 13 is similar to that of the second embodiment, and therefore the explanation thereof will be omitted.

The first electrode E1 and the relay electrode RE are formed to be apart from each other on the third insulating film 13. That is, the first electrode E1 is formed in a region on the third insulating film 13, which overlaps, for example, the drain electrode DE1 of the first switch SW1 and a part of the second switch SW2. The first electrode E1 is connected to the drain electrode DE1 of the first switch SW1 through a contact hole CH3 formed in the third insulating film 13. The relay electrode RE is formed in a region on the third insulating film 13, which overlaps, for example, the source electrode SE2 of the second switch SW2. The relay electrode RE is connected to the source electrode SE2 of the second switch SW2 through a contact hole CH4 formed in the third insulating film 13.

The first alignment film AL1 is formed to cover the first electrode E1 and the relay electrode RE and also on the third insulating film 13. Note that a part of the relay electrode RE is not covered with the first alignment film AL1 so as to be electrically connected with the second electrode E2 described later.

On the other hand, the second substrate SUB2 is formed from, for example, a transparent insulating substrate 20 such as of glass or resin. The second substrate SUB2 comprises a spacer 21, a second electrode E2, a second alignment film AL2, a color filter (not shown), a light-shielding layer (not shown), and the like, on a side which opposes the first substrate SUB1 of the insulating substrate 20.

The spacer 21 is provided in the insulating substrate 20 so as to oppose the relay electrode RE provided in the first substrate SUB1. The spacer 21 has a section of reverse tapered shape, for example, and defines the thickness of the liquid crystal layer LQ by its height (that is, the size thereof along the direction perpendicular to the main surface of the insulating substrate 20). The spacer 21 is formed from, for example, an organic insulating material.

The second electrode E2 covers the spacer 21 and also the insulating substrate 20. With this configuration, the second electrode E2 is located to oppose the first electrode E1 provided on the first substrate SUB1. The second electrode E2 is connected with the relay electrode RE of the first substrate SUB1 by an end of the spacer 21, which is on a first substrate SUB1 side.

The second alignment film AL2 covers the second electrode E2 and the insulating substrate 20 except for the region, for example, where the spacer 21 is formed. Note that it suffices if the second alignment film AL2 is removed at least in the end where the second electrode E2 is in contact with the relay electrode RE, and for example, the second alignment film AL2 may cover a side of the spacer 21.

According to this embodiment, an advantageous effect similar to that of the second embodiment can be obtained.

(Fourth Embodiment)

FIG. 6 is a circuit diagram showing an example of a pixel PX of a display device according to the fourth embodiment.

The fourth embodiment is different from the first to third embodiments in that a gate electrode GE1 of a first switch SW1 and a gate electrode GE2 of a second switch SW2 are connected to different gate lines G11 and G12.

More specifically, the gate electrode GE1 of the first switch SW1 is connected to the first gate line G11, whereas the gate electrode GE2 of the second switch SW2 is connected to the second gate line G12 provided, for example, parallel to the first gate line G11.

According to this embodiment, the first switch SW1 and the second switch SW2 can be driven independently. For example, when the first switch SW1 and the second switch SW2 are driven simultaneously, and especially, if the first switch SW1 and the second switch SW2 are switched to the off state simultaneously, the variation in field-through voltage occurring among the switches may give rise to errors in the video signals, adversely affecting the display. However, according to this embodiment, the first switch SW1 and the second switch SW2 can be switched to the off state at different times, thereby making it possible to suppress the errors in video signals and improve the display quality.

Moreover, the second electrode E2 can be utilized as a part of the touch detection mechanism. That is, as a part of the touch detection mechanism, a drive pulse is given to the second electrode E2 via a common line VcomL only during the touch detection period. Thus, in this touch detection period, only the second switch SW2 can be switched on by the control signal from the second gate line G12 (the first switch SW1 is in the off state). During this touch detection, the change in capacitance between the second electrode E2 and a plurality of detection electrodes Rx (not shown) arranged on the display surface side (for example, the outer surface of the glass substrate of the second substrate SUB2) is extracted as a touch detection signal. The touch detection mechanism utilizes the phenomenon that the capacitance between any of the detection electrodes Rx and the second electrode E2 varies depending on a conductor (a fingertip of the user or the like) touching the display surface side or not. That is, the capacitance value between a detection electrode Rx and the second electrode E2 differs from when a conductor is close to or touches the detection electrode Rx to when not.

(Fifth Embodiment)

FIG. 7 is a circuit diagram showing an example of a pixel PX of a display device according to the fifth embodiment. The fifth embodiment is different from the first to fourth embodiments in that it comprises an organic electroluminescence (EL) element as a display element.

The display device according to this embodiment comprises first to third gate lines G11 to G13 each extending along the first direction X, a power line DL and a source line S5 extending along the second direction Y, etc.

The pixel PX comprises a first switch SW1, a second switch SW2, a third switch SW3, a thin film transistor Tr1, a capacitor Cs, an organic EL device OD, etc. The first to third switches SW1 to SW3 are each formed from, for example, a P-type thin film transistor. The capacitor Cs includes a third electrode E3 and a fourth electrode E4.

In the pixel PX, one of the electrodes of the organic EL device OD, that is, an electrode E5, is connected to one of the electrodes of the thin film transistor Tr1, that is, an electrode E7, via the third switch SW3. The other electrode of the organic EL device OD, an electrode E6, is connected to a wiring line of the ground potential. A gate electrode GEt of the thin film transistor Tr1 is connected to the third electrode E3 of the capacitor Cs and a drain electrode DE1 of the first switch SW1. The other electrode of the thin film transistor Tr1, that is, an electrode E8 is connected to the fourth electrode E4 of the capacitor Cs and a drain electrode DE2 of the second switch SW2. The source electrode SE1 of the first switch SW1 is connected to the source line S5 and the gate electrode GE1 is connected to the first gate line G11. The source electrode SE2 of the second switch SW2 is connected to the power line DL, to which a fixed potential is supplied, and the gate electrode GE2 is connected to the second gate line G12. A gate electrode GE3 of the third switch SW3 is connected to the third gate line G13.

Figure 8A:
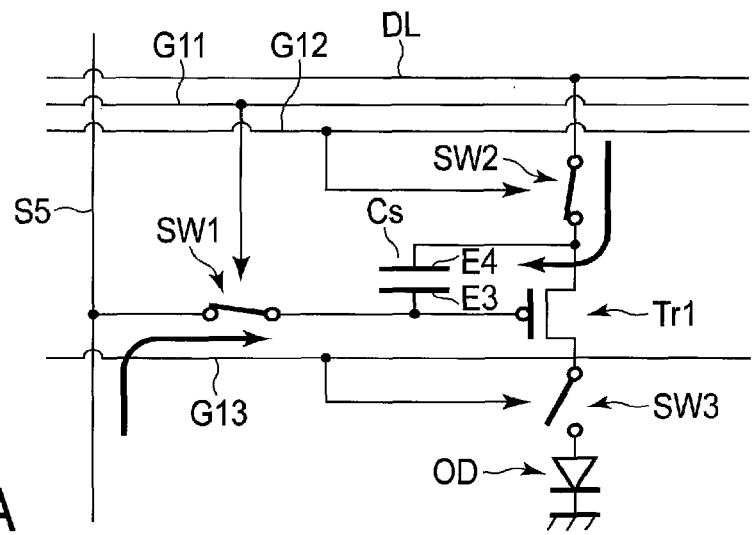
FIG. 8A is a circuit diagram showing an example of operation of the display device shown in FIG. 7.
Figure 8B:
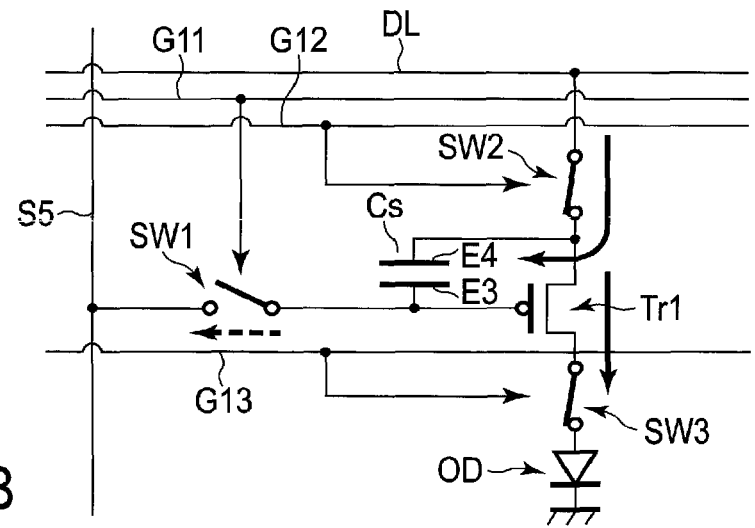
FIG. 8B is a diagram showing another example of the operation of the display device shown in FIG. 7.
Figure 8C:
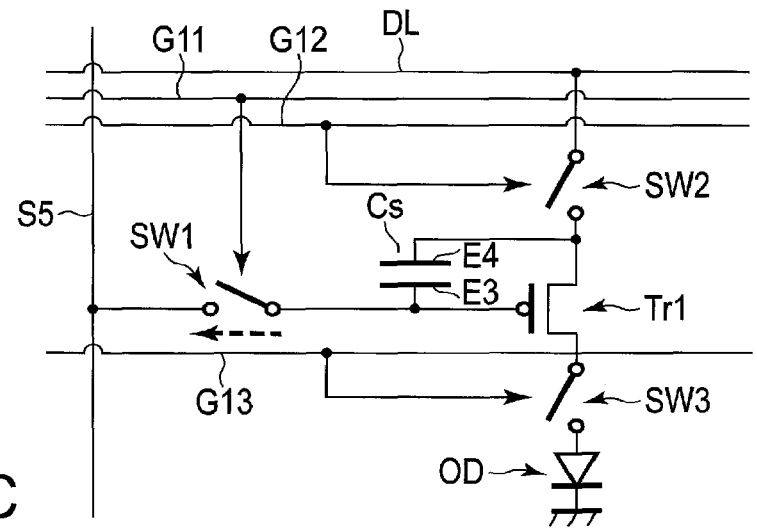
FIG. 8C is a diagram showing still another example of the operation of the display device shown in FIG. 7.

Next, the operation of the pixel PX will be described briefly with reference to FIGS. 8A to 8C. FIG. 8A shows the state of the pixel PX when writing a signal, FIG. 8B shows that when emitting light, and FIG. 8C shows that when not emitting light. In FIGS. 8A to 8C, an arrow of a solid line indicates current and an arrow of a dashed line indicates leak current.

Now, when a low-level scanning signal is supplied to the first gate line G11 as shown in FIG. 8A, the first switch SW1 is turned on. Thereby, the signal potential supplied to the source line S5 is held at the third electrode E3 of the capacitor Cs. Here, let us suppose that the signal potential is 5V, for example. On the other hand, when a low-level scanning signal is supplied to the second gate line G12, the second switch SW2 is turned on. Thereby, the fixed potential supplied to the power line DL is held at the fourth electrode E4 of the capacitor Cs. Here, let us supposes that the fixed potential is 15V, for example. When the voltage VCs between the third and fourth electrodes E3 and E4 of the capacitor Cs becomes a predetermined value (for example, −10V), the thin film transistor Tr1 is switched to the on state.

Next, when a high-level scanning signal is supplied to the first gate line G11 as shown in FIG. 8B, the first switch SW1 is switched to the off state. On the other hand, when a low-level scanning signal is supplied to the third gate line G13, the third switch SW3 is switched to the on state. Thereby, the thin film transistor Tr1 and the organic EL device OD are brought into conduction to allow current flow into the thin film transistor Tr1 according to the voltage VCs held at the storage capacitor Cs. The organic EL device OD emits light at a brightness according to the current flowing through the thin film transistor Tr1.

Next, when a high-level scanning signal is supplied to the third gate line G13 as shown in FIG. 8C, the third switch SW3 is switched to the off state to place the organic EL device OD in a non-light-emission state. On the other hand, if a high-level scanning signal is supplied to the second gate line G12, the second switch SW2 is turned off. Thereby, the capacitor Cs is set in a floating state.

Here, when leak current occurs between the source and drain electrodes of the first switch SW1, the potential of the third electrode E3 of the capacitor Cs falls from 5V by only the potential displacement ΔV caused by the leak current. On the other hand, the second switch SW2 is in the off state and the fourth electrode E4 of the capacitor Cs is not brought into conduction with the power line DL. Therefore, the potential of the fourth electrode E4 falls by only ΔV as in the third electrode E3. As a result, even if leak current occurs in the first switch SW1, the voltage held at the capacitor Cs does not ideally vary. The state of FIG. 8C occurs in the non-display period (the black display period, the touch-sensor operation period or the like).

According to this embodiment, the capacitor Cs can be set in the floating state during the period of not emitting light, in which the third switch SW3 is in the off state, by connecting the first switch SW1 to the third electrode E3 of the capacitor Cs and the second switch SW2 to the fourth electrode E4. In the display device comprising the organic EL device OD, it is sometimes necessary to restrict the current supply to the organic EL device OD temporarily when, for example, driven to insert black or to operate the built-in touch sensor. According to this embodiment, during such a non-light-emission period as described above, the voltage for driving the thin film transistor Tr1 can be held by the capacitor Cs which is in the floating state. Thus, video signals can be held for a long time as compared to the case where the second switch SW2 is not provided. Consequently, the device can be driven at low voltage and the power consumption can be suppressed. Naturally, the operation of the device can contribute also to improvement of higher definition and quality of display image. Moreover, the video signals can be stably retained for a long time, and therefore it becomes effective also when driving at low frequency to reduce the power consumption.

(Sixth Embodiment)

Figure 9:
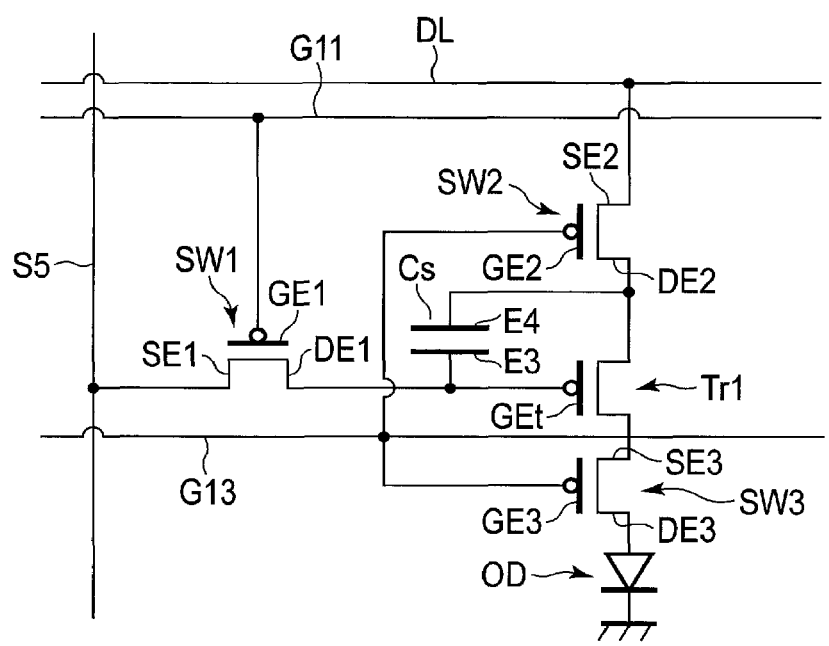
FIG. 9 is a circuit diagram showing an example of a display device according to the sixth embodiment.

FIG. 9 is a circuit diagram showing an example of a pixel PX of a display device according to the sixth embodiment.

The sixth embodiment is different from the fifth embodiment in that a gate electrode GE2 of a second switch SW2 is connected to a third gate line G13.

According to this embodiment, the gate electrode GE2 of the second switch SW2 and a gate electrode GE3 of the third switch SW3 is connected to the third gate line G13. That is, the second switch SW2 and the third switch SW3 share a control line. Therefore, the number of control lines can be reduced, making it possible to increase the density of pixels PX and achieve even higher definition in the display device. In this circuit, the operations of the switch SW1, SW2 and SW3 are the same as those of the example described with FIGS. 8A to 8C.

Note that in the fourth to sixth embodiments, the first switch SW1 and the second switch SW2 may be formed in a similar fashion to those of the second and third embodiments. That is, as shown in FIGS. 4 and 5, the first semiconductor layer SC1 which constitutes the first switch SW1 is provided on the insulating substrate 10 and the second semiconductor layer SC2 which constitutes the second switch SW2 is formed on at least a single insulating film layer which covers at least the first semiconductor layer SC1 so that the channel region SCc1 of the first semiconductor layer SC1 and the channel region SCc2 of the second semiconductor layer SC2 partly overlap each other.

(Seventh Embodiment)

Figure 10:
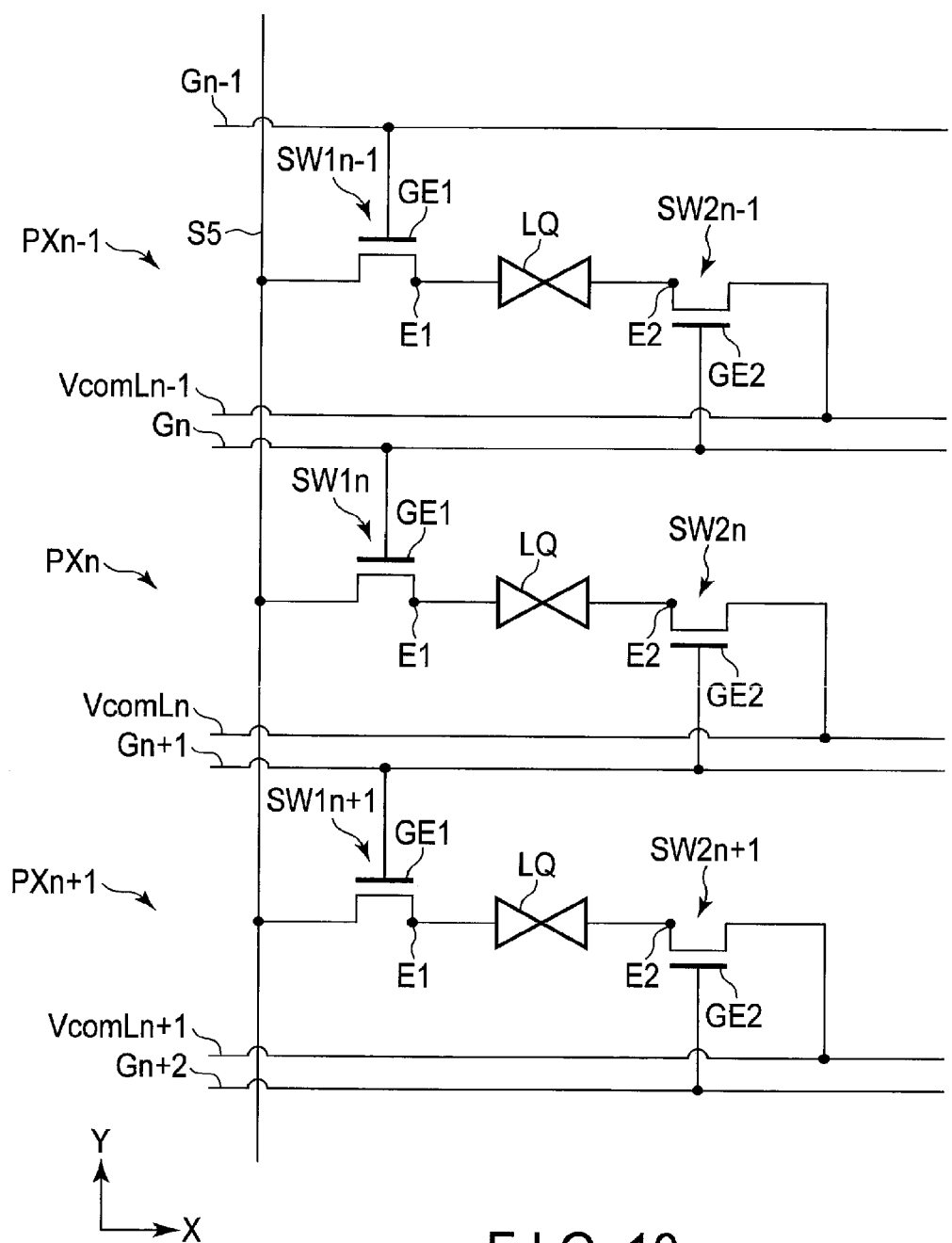
FIG. 10 is a circuit diagram showing an example of a display device according to the seventh embodiment.

FIG. 10 is a circuit diagram showing an example of pixels PX of a display device according to the seventh embodiment.

The seventh embodiment is different from the first to sixth embodiments in that a gate electrode GE2 of a second switch SW2 shares a control line with a gate electrode GE1 of a first switch SW1 contained in an adjacent pixel. In this embodiment, the first switch SW1 and the second switch SW2 are each, for example, an N-type thin film transistor. Note that this embodiment describes a liquid crystal display comprising a liquid crystal layer LQ as an example, and naturally is applicable also to a display device comprising an organic EL device.

In this embodiment, a pixel PXn (to be referred to as a pixel of n-th row hereinafter) includes a first switch SW1n connected to a gate line Gn of an n-th row, and a second switch SW2n, and a gate electrode GE2 of the second switch SW2n is connected to a gate line Gn+1 of an n+1-th row. That is, to the gate line Gn+1 of the n+1-th row, a gate electrode GE1 of a first switch SW1n+1 included in a pixel PXn+1 of an n+1-th row and a gate electrode GE2 of a second switch SW2n included in the pixel PXn of the n-th row are connected.

FIG. 11 is a timing chart illustrating gate signals supplied to gate lines Gn−1, Gn and Gn+1. The basic operation of this embodiment will be described with reference to FIGS. 11 and 10.

In this embodiment, the display device is driven in such a manner that two first switches SW1n and SW1n+1 connected respectively to two gate lines Gn and Gn+1 adjacent to each other along the second direction Y, for example, are temporarily set in an on state simultaneously (or to have an overlapping period).

Let us supposes now that at a time $t_0$, first switches SWn−1, SW1n and SWn+1 connected respectively to gate lines Gn-1, Gn and Gn+1 of n−1, n and n+1-th rows are in an off state. That is, at the time $t_0$, a low-level gate potential is supplied to the gate lines Gn-1, Gn and Gn+1 of the n−1, n and n+1-th rows.

Next, in at a time $t_1$, a high-level gate potential is supplied to the gate line Gn-1 of the n−1-th row. Thereby, in the pixel PXn-1 of the n−1-th row, the first switch SWn-1 is switched from the off state to the on state.

Next, at a time $t_2$, a high-level gate potential is supplied to the gate line Gn of the n-th row. Thereby, in the pixel PXn of the n-th row, the first switch SW1n is switched from the off state to the on state. Further, in the pixel PXn-1 of the n−1-th row, the second switch SW2n-1 is switched from the off state to the on state. That is, in the pixel PXn-1, the first switch SW1n-1 and the second switch SW2n-1 are turned on, and a write period A is started.

Next, at a time $t_3$, a low-level gate potential is supplied to the gate line Gn-1 of the n−1-th row. Thereby, in the pixel PXn-1 of the n−1-th row, the first switch SWn-1 is switched from the on state to the off state. Thereby, the write period A of the pixel PXn-1 is finished.

Moreover, at the time $t_3$, a high-level gate potential is supplied to the gate line Gn+1 of the n+1-th row. Thereby, in the pixel PXn+1 of the n+1-th row, the first switch SW1n+1 is switched from the off state to the on state. Further, in the pixel PXn of the previous n-th row, the second switch SW2n is switched from the off state to the on state. That is, in the pixel PXn, the first switch SW1n and the second switch SW2n are set in the on state, and a write period B is started.

Next, at a time $t_4$, a low-level gate potential is supplied to the gate line Gn of the n-th row. Thereby, in the pixel PXn of the n-th row, the first switch SWn is switched from the on state to the off state. Thereby, the write period B of the pixel PXn is finished.

Further, in the pixel PXn-1 of the n−1-th row, the second switch SW2n-1 is switched from the on state to the off state. In the pixel PXn-1, the first switch SW1n-1 is already off at the time t3. Therefore, when the second switch SW2n-1 is turned off at the time t4, the liquid crystal element LQ of the pixel PXn-1 is set in the floating state.

Moreover, at the time $t_4$, a high-level gate potential is supplied to a gate row Gn+2 of an n+2-th row. Thereby, in the pixel PXn+1 of the n+1-th row, the second switch SW2n+1 is switched from the off state to the on state. That is, in the pixel PXn+1, the first switch SW1n+1 and the second switch SW2n+1 are set in the on state, and a write period C is started.

Next, at a time $t_5$, a low-level gate potential is supplied to the gate line Gn+1 of the n+1-th row. Thereby, in the pixel PXn+1 of the n+1-th row, the first switch SWn+1 is switched from the on state to the off state. Thereby, the write period C of the pixel PXn+1 is finished.

Further, in the pixel PXn of n-th row, the second switch SW2 is switched from the on state to the off state. In the pixel PXn, the first switch SW1n is already off at the time $t_4$. Therefore, when the second switch SW2n is turned off at the time t5, the liquid crystal element LQ of the pixel PXn is set in the floating state.

According to this embodiment, the gate electrode GE2 of the second switch SW2n included in the pixel PXn of the n-th row is connected to the gate line Gn+1 of the n+1-th row, and thus the second switch SW2n included in a pixel of n-th row and the first switch SW1n+1 included in a pixel PXn+1 of the n+1-th row are controlled with the gate line Gn+1 of the n+1-th row. Moreover, the gate signal supplied to the gate line Gn of the n-th row and the gate signal supplied to the gate line Gn+1 of the n+1-th row temporarily overlap each other. Thereby, in each pixel PX, the finish time of a write-in period and the time of separation from the common lines VcomL can be separated from each other. That is, the first switch SW1 and the second switch SW2 can be switched to the off state at different times without increasing the number of control lines. Therefore, the signal errors, which may be generated when the first switch SW1 and the second switch SW2 are turned off simultaneously, for example, can be suppressed, and thus the display quality of the display device can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
pixel circuits arranged in a matrix in a display area, the pixel circuits each comprising:
a display element;
a capacitor which applies voltage to at least one of electrodes of the display element;
a first switch which supplies voltage to the capacitor when in an on state; and
a second switch which is set in an off state with the first switch when the first switch is in the off state, and sets the capacitor in a floating state;
wherein
the display element is a liquid crystal element comprising a liquid crystal layer;
a first electrode of the liquid crystal element is connected to a signal line through the first switch, whereas a second electrode of the liquid crystal element is connected to a wiring line of a predetermined potential through the second switch;
the first electrode and the second electrode overlap each other via a first insulating film;
a control electrode of the first switch is connected to a gate line disposed in the display area;
the first switch comprises a first semiconductor layer provided on a first substrate including the pixel circuits;
the second switch comprises a second semiconductor layer provided on a second insulating film which covers at least the first semiconductor layer;
a channel region of the first semiconductor layer and a channel region of the second semiconductor layer at least partially overlap each other;
the control electrode of the first switch is provided between the first semiconductor layer and the second semiconductor layer; and
a control electrode of the second switch is shared with the control electrode of the first switch.

2. The display device of claim 1, wherein
the first and second gate lines extend along a first direction, and
when the first switch and the second switch are included in a first pixel circuit, a control electrode of a first switch included in a second pixel circuit adjacent to the first pixel circuit along a second direction crossing the first direction is connected to the second gate line.

3. The display device of claim 1, wherein
the first electrode and the second electrode are provided between the first substrate and the liquid crystal layer.

4. The display device of claim 1, wherein
the display element is an organic electroluminescence element,
one of electrodes of the organic electroluminescence element is connected to one of electrodes of a thin film transistor via a third switch,
a control electrode of the thin film transistor is connected to one of electrodes of the capacitor and the first switch connected to a signal line, and
an other one of the electrodes of the thin film transistor is connected to an other one of the electrodes of the capacitor and the second switch connected to a wiring line of a predetermined potential.

5. The display device of claim 4, wherein
the control electrode of the first switch is connected to a first gate line disposed in the display area,
the control electrode of the second switch is connected to a second gate line disposed in the display area, and
a control electrode of the third switch is connected to a third gate line disposed in the display area.

6. The display device of claim 4, wherein
the control electrode of the first switch is connected to a first gate line disposed in the display area, and the control electrode of the second switch and a control electrode of the third switch are connected to a third gate line disposed in the display area.

7. The display device of claim 1, wherein
a total value of parasitic capacitances of the first electrode is higher than that of parasitic capacitances of the second electrode.

8. A display device comprising:
a signal line;
a gate line crossing the signal line;
a common line to which a common potential is supplied;
a liquid crystal element including a first electrode and a second electrode;
a first switch connected to the first electrode and the signal line; and
a second switch connected to the second electrode and the common line,
wherein
the first electrode and the second electrode overlap each other via a first insulating film;
a control electrode of the first switch is connected to the gate line;
the first switch comprises a first semiconductor layer provided on a first substrate;
the second switch comprises a second semiconductor layer provided on a second insulating film which covers at least the first semiconductor layer;
a channel region of the first semiconductor layer and a channel region of the second semiconductor layer at least partially overlap each other;
the control electrode of the first switch is provided between the first semiconductor layer and the second semiconductor layer; and
a control electrode of the second switch is shared with the control electrode of the first switch.

9. The display device of claim 8, further comprising:
a second liquid crystal element including a third electrode and a fourth electrode;
a third switch connected to the third electrode and the signal line; and
a fourth switch connected to the fourth electrode,
wherein the control electrode of the second switch and a control electrode of the third switch are connected to the second gate line.

10. The display device of claim 1, wherein
the first switch includes a first source electrode connected to the signal line and a first drain electrode connected to the first electrode, and
the second switch includes a second source electrode connected to the second electrode and a second drain electrode connected to a common line.

11. The display device of claim 1, wherein
the second electrode is formed on an organic insulating film,
the first insulating film is formed on the organic insulating film and covers the second electrode,
the first electrode is formed on the first insulating film, and the first insulating film is formed of an inorganic insulating material.

* * * * *